US009825023B2

United States Patent
Basler et al.

(10) Patent No.: US 9,825,023 B2
(45) Date of Patent: Nov. 21, 2017

(54) INSULATED GATE BIPOLAR TRANSISTOR COMPRISING NEGATIVE TEMPERATURE COEFFICIENT THERMISTOR

(71) Applicant: Infineon Technologies Austria AG, Villach (AT)

(72) Inventors: Thomas Basler, Riemerling (DE); Erich Griebl, Dorfen (DE); Joachim Mahler, Regensburg (DE); Daniel Pedone, Munich (DE); Wolfgang Scholz, Olching (DE); Philipp Seng, Munich (DE); Peter Tuerkes, Unterhaching (DE); Stephan Voss, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/880,924

(22) Filed: Oct. 12, 2015

(65) Prior Publication Data

US 2016/0111415 A1    Apr. 21, 2016

(30) Foreign Application Priority Data

Oct. 21, 2014  (DE) .................. 10 2014 115 314

(51) Int. Cl.
    *H01L 29/66*   (2006.01)
    *H01L 27/02*   (2006.01)
    (Continued)

(52) U.S. Cl.
    CPC ...... *H01L 27/0288* (2013.01); *H01L 27/0629* (2013.01); *H01L 29/0834* (2013.01);
    (Continued)

(58) Field of Classification Search
    CPC ........... H01L 27/0288; H01L 29/41708; H01L 29/0821; H01L 29/7395; H01L 27/0629; H01L 29/66333; H01L 29/1095
    (Continued)

(56) References Cited

U.S. PATENT DOCUMENTS

2010/0327314 A1*  12/2010  Huang ............... H01L 29/0834
                                              257/139
2011/0210302 A1*  9/2011   Tsukada ............ H01L 27/2445
                                              257/2
(Continued)

FOREIGN PATENT DOCUMENTS

DE         10361714 A1    8/2005
DE    102013108946 A1    3/2014

*Primary Examiner* — Phat X Cao
*Assistant Examiner* — Mohammad M Hoque
(74) *Attorney, Agent, or Firm* — Murphy, Bilak & Homiller, PLLC

(57) ABSTRACT

An embodiment of an IGBT comprises an emitter terminal at a first surface of a semiconductor body. The IGBT further comprises a collector terminal at a second surface of the semiconductor body. A first zone of a first conductivity type is in the semiconductor body between the first and second surfaces. A collector injection structure adjoins the second surface, the collector injection structure being of a second conductivity type and comprising a first part and a second part at a first lateral distance from each other. The IGBT further comprises a negative temperature coefficient thermistor adjoining the first zone in an area between the first and second parts.

19 Claims, 5 Drawing Sheets

(51) Int. Cl.
   *H01L 27/06* (2006.01)
   *H01L 29/739* (2006.01)
   *H01L 29/08* (2006.01)

(52) U.S. Cl.
   CPC .... *H01L 29/66348* (2013.01); *H01L 29/7395* (2013.01); *H01L 29/7397* (2013.01)

(58) Field of Classification Search
   USPC ........................................................ 257/140
   See application file for complete search history.

(56) References Cited

U.S. PATENT DOCUMENTS

2012/0181575 A1* 7/2012 Pfirsch ................ H01L 29/0834
   257/139
2014/0073102 A1* 3/2014 Toyoda ............. H01L 21/82380
   438/270
2014/0264343 A1* 9/2014 Harrington, III ... H01L 29/7803
   257/51

\* cited by examiner

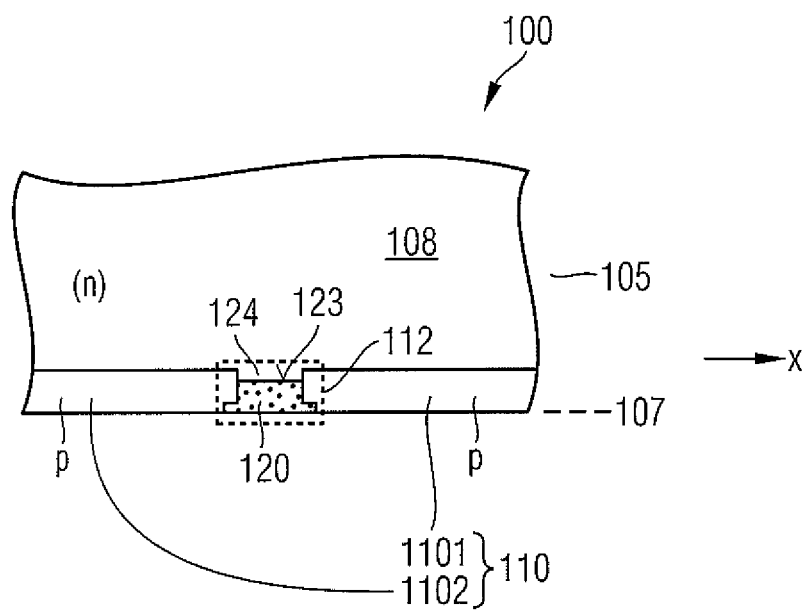
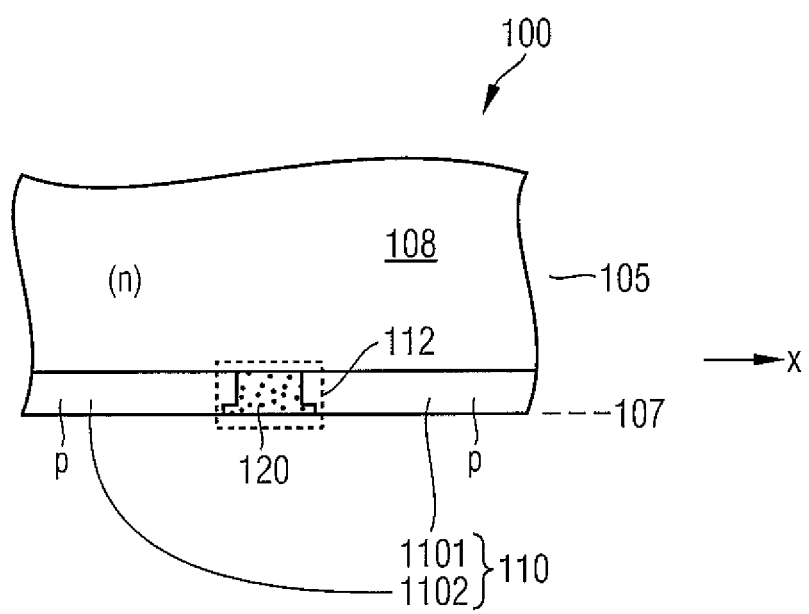

US 9,825,023 B2

INSULATED GATE BIPOLAR TRANSISTOR COMPRISING NEGATIVE TEMPERATURE COEFFICIENT THERMISTOR

BACKGROUND

The present application claims priority under 35 USC §119 to German (DE) Patent Application Serial No. DE 10 2014 115 314.6 filed on Oct. 21, 2014. The disclosure in this priority application is hereby incorporated fully by reference into the present application.

BACKGROUND ART

In semiconductor power applications low-inductive intermediate short-circuits may occur accompanied by high currents. Such intermediate short-circuits may be caused by driving disturbances, semiconductor failure, or short-circuits of loads, for example. Semiconductor switches such as insulated gate bipolar transistors (IGBTs), insulated gate field effect transistors (IGFETs) such as metal oxide semiconductor field effect transistors (MOSFETs) or bipolar junction transistors may actively limit short-circuit currents for protecting the overall application and peripheral devices against damage. Avoiding damage of the semiconductor switches requires a fast turn-off in short-circuit mode because of high electrical losses in the semiconductor due to the applied full intermediate voltage.

It is desirable to provide an IGBT having an improved short-circuit robustness.

SUMMARY

According to an embodiment of an IGBT, the IGBT comprises an emitter terminal at a first surface of a semiconductor body. The IGBT further comprises a collector terminal at a second surface of the semiconductor body. A first zone of a first conductivity type is in the semiconductor body between the first and a second surface. A collector injection structure adjoins the second surface, the collector injection structure being of a second conductivity type and comprising a first part and a second part at a first lateral distance from each other. The IGBT further comprises a negative temperature coefficient thermistor adjoining the first zone in an area between the first and second parts.

According to a method of manufacturing an IGBT, the method comprises forming a collector injection structure at a second surface of a semiconductor body having opposite first and second surfaces, wherein the semiconductor body includes a first zone of a first conductivity type and the collector injection structure is of a second conductivity type comprising a first part and a second part at a first lateral distance from each other. The method further comprises forming a negative temperature coefficient thermistor adjoining the first zone in an area between the first and second parts.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 2 to 6 illustrate cross-sectional views of different arrangements of a negative temperature coefficient thermistor between a collector terminal and a drift zone of an IGBT.

DETAILED DESCRIPTION

Figure 1:
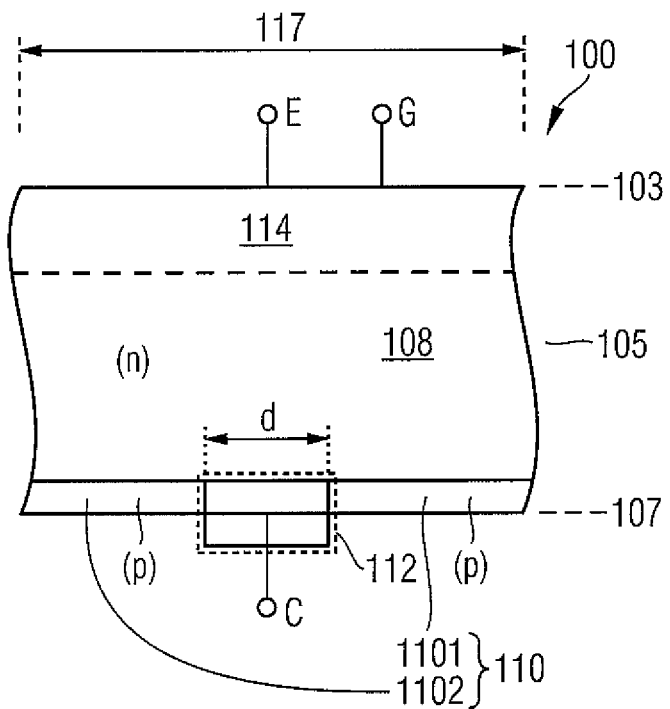
FIG. 1 is a schematic cross-sectional view illustrating an insulated gate bipolar transistor according to an embodiment including.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "$n^-$" means a doping concentration that is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

An embodiment of an insulated gate bipolar transistor 100 is illustrated in the schematic cross-sectional view of FIG. 1.

The IGBT 100 includes an emitter terminal E at a first surface 103 of a semiconductor body 105. A collector terminal C is at a second surface 107 of the semiconductor body 105. A first zone 108 of a first conductivity type, for example an re-type is in the semiconductor body 105 between the first and second surfaces 103, 107. A collector injection structure 110 adjoins the second surface 107. The collector injection structure 110 is of a second conductivity type, for example a p-type and comprises a first part 1101 and a second part 1102 at a first lateral distance d from each other. A negative temperature coefficient thermistor adjoins the first zone 108 in an area 112 between the first and second parts 1101, 1102 of the collector injection structure 110.

The IGBT 100 further includes a gate terminal G. Structural elements of an emitter of the IGBT 100, for example source and body regions are located in a functional region 114 of the semiconductor body 105 adjoining the first surface 103. The source region is of the first conductivity type similar to the first zone 108. The body region is of the second conductivity type similar to the collector injection structure 110. According to an embodiment, the gate of the IGBT 100 includes a gate dielectric and a gate electrode located in a gate trench extending into the semiconductor body 105 from the first surface 103. According to another embodiment, the gate of the IGBT 100 is a planar gate including the gate dielectric and the gate electrode arranged above the first surface 103. In the functional region IGBT cells may be arranged in a cell array. The cell array may be a two dimensional arrangement of IGBT cells. Examples of IGBT cell geometries are square IGBT cells, rectangular IGBT cells, circular IGBT cells, elliptical IGBT cells, polygonal IGBT cells, for example hexagonal or octagonal IGBT cells.

A drift zone of the first conductivity type is located between the functional region 114 and the second surface 107 and constitutes part of the first zone 108. The first zone 108 is a continuous region of the first conductivity type and may include a plurality of associated semiconductor regions of the first conductivity type, for example the drift zone, an optional field stop zone and short regions adjoining the second surface 107 between the first and second parts 1101, 1102 of the collector injection structure 110.

According to an embodiment, the negative temperature coefficient thermistor in the area 112 is a material characterized by a phase change from an amorphous phase into a crystalline phase at a critical temperature. According to an embodiment, the material is a chalcogenide. For example, the chalcogenide includes at least one of GeTe and $Ge_2Sb_2Te_5$.

Other suitable chalcogenides are $Sb_2Te_3$ in other atomic compositions of the GeSbTe system. For a better performance and manufacturability those phase change materials may be integrated in a highly thermal conductive matrix like single wall carbon nanotubes (SWNT). Other options for the adjustment of the phase transition temperature are the mixing or doping with polymers, ceramics or semiconductor materials. According to an aspect, the phase change may be reversible. According to another embodiment, the negative temperature coefficient thermistor is a semiconductor material having a bandgap energy smaller than the bandgap energy of the semiconductor body. For a semiconductor body made of silicon having a bandgap energy of 1.12 eV the negative temperature coefficient thermistor may include germanium (Ge) having a bandgap energy of 0.67 eV.

The embodiment illustrated in FIG. 1 includes an optimized collector for improving short-circuit robustness of the IGBT 100. The short-circuit robustness of the IGBT 100 is improved by reducing the saturation current during short-circuit, thereby reducing electrical losses during short-circuit and reducing an increase in temperature. Furthermore, the bipolar current gain is kept low which helps to reduce the leakage current after short-circuit turn-off. The first zone 108 including the drift zone is electrically coupled to the collector terminal C via the negative temperature coefficient thermistor in the area 112. In normal operation mode, for example at operation temperatures smaller than 175° C., the negative temperature coefficient thermistor in the area 112 has a high resistance. Thus, electrons in the first zone 108 do not have a direct electric path to the collector terminal C and the IGBT 100 is operating in bipolar mode. During short-circuit high temperatures occur, for example temperatures above 175° C. and the negative temperature coefficient material in the area 112 becomes low resistive. This provides a direct electrical path for electrons flowing from the first zone 108, for example the drift zone through the negative temperature coefficient material in the area 112 between the first and second parts 1101, 1102 to the collector terminal C. As a consequence, bipolar mode of the IGBT 100 is reduced and the IGBT 100 may even switch to unipolar mode. This leads to a reduction of the short-circuit current and the saturation current respectively. Thus, the overall current flowing in the IGBT 100 is determined by a channel current controlled via the gate terminal G. The reduction of the short-circuit current and the saturation current respectively suppresses or reduces a further increase in temperature, thereby counteracting or suppressing thermal device destruction and, hence, improving the short-circuit robustness. Furthermore, the bipolar current gain is kept low which helps to reduce the leakage current after short-circuit turn-off.

According to an embodiment, the first lateral distance d between the first and second parts 1101, 1102 of the collector injection structure 110 is a range between 0.5 μm and 500 μm, for example between 1 μm and 50 μm.

According to an aspect, a plurality of separate negative temperature coefficient thermistors adjoining the first zone 108 may be arranged. Dimensions and/or geometries and/or distances of the plurality of separate negative temperature coefficient thermistors with respect to each other may be different or partly different.

According to an embodiment, the first and second parts 1101, 1102 are arranged in a transistor cell area 117. In the transistor cell area 117, the emitter terminal E and/or the gate terminal G is in electric contact with the first surface 103 of the semiconductor body 105. By way of example, the emitter terminal E may be electrically connected to a source region in the functional region 114 via a contact plug and/or a contact line on the first surface 103. Likewise, the gate terminal G may be electrically connected to the gate electrode G. A junction termination area is different from the transistor cell area 117 with regard to function and structure. Whereas the load terminals of the IGBT 100, i.e. the emitter terminal E and the collector terminal C are for the purpose of current conduction in the transistor cell area 117, the purpose of the junction termination area is an edge termination necessary to reduce the electric field peak at the periphery of the IGBT 100. Typical structural elements of the junction termination area include one or more of field plates, ring structures such as floating guard rings or ring segments, junction termination extension (JTE) structures and variation of lateral doping (VLD) structures, for example.

Figure 2:
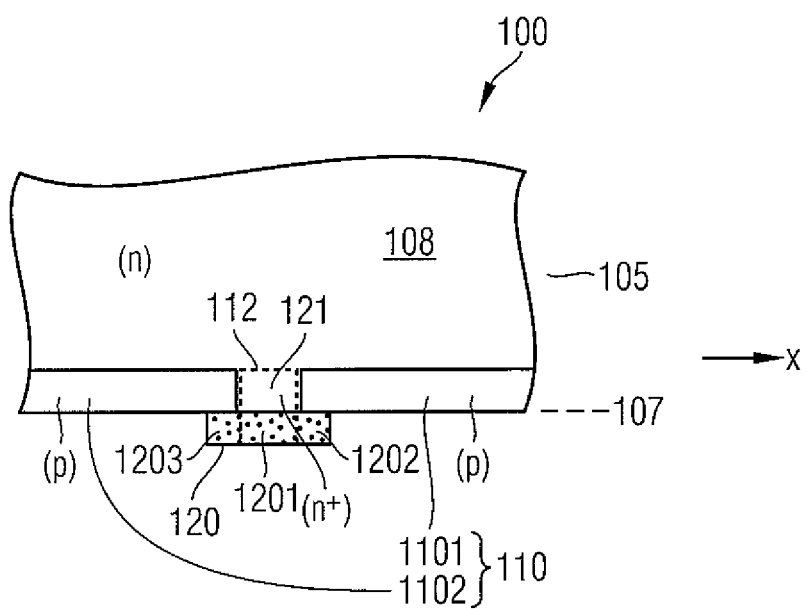

In the schematic cross-sectional view of the IGBT 100 illustrated in FIG. 2, a negative temperature coefficient thermistor 120 is arranged at the second surface 107. A first part 1201 of the negative temperature coefficient thermistor 120 is arranged in the area 112 and second parts 1202, 1203 of the negative temperature coefficient thermistor 120 are arranged outside the area 112 and cover the first and second parts 1101, 1102 of the collector injection structure 110. According to other embodiments, the second parts 1202, 1203 of the negative temperature coefficient thermistor 120 may be omitted.

A short region 121 of the first zone 108 is sandwiched between the first and second parts 1101, 1102 of the collector injection structure 110 along the lateral direction x. According to an embodiment the first zone 108 includes a drift region having a smaller doping concentration than the short region 121. According to an embodiment, the short region 121 is n-doped or $n^+$-doped.

In the schematic cross-sectional view of the IGBT 100 illustrated in FIG. 3, the negative temperature coefficient thermistor 120 is sandwiched between the first and second parts 1101, 1102 of the collector injection structure 110 along the lateral direction x. According to the illustrated embodiment, an interface 123 between the negative temperature coefficient thermistor 120 and a first part 124 of the first zone 108 is sandwiched between the first and second parts 1101, 1102 of the collector injection structure 110 along the lateral direction x. Thus, a bottom part of the area 112 sandwiched between the first and second parts 1101, 1102 includes the negative temperature coefficient thermistor 120. A top part of the area 112 between the first and second parts 1101, 1102 includes the first part 124 of the first zone 108. According to an embodiment, the first part 124 of the first zone 108 has a greater doping concentration than a drift region of first zone 108. By way of example, the first part 124 of the first zone 108 may be part of a field stop zone defined by one or more of a diffusion process through the second surface 107 and an ion implantation process through the second surface 107 such as a process of implanting protons and/or phosphorus and/or selenium through the second surface 107.

According to another embodiment of the IGBT 100 illustrated in the schematic cross-sectional view of FIG. 4, the area 112 between the first and second parts 1101, 1102 of the collector injection structure 110 is fully covered with the negative temperature coefficient thermistor 120.

Figure 5:
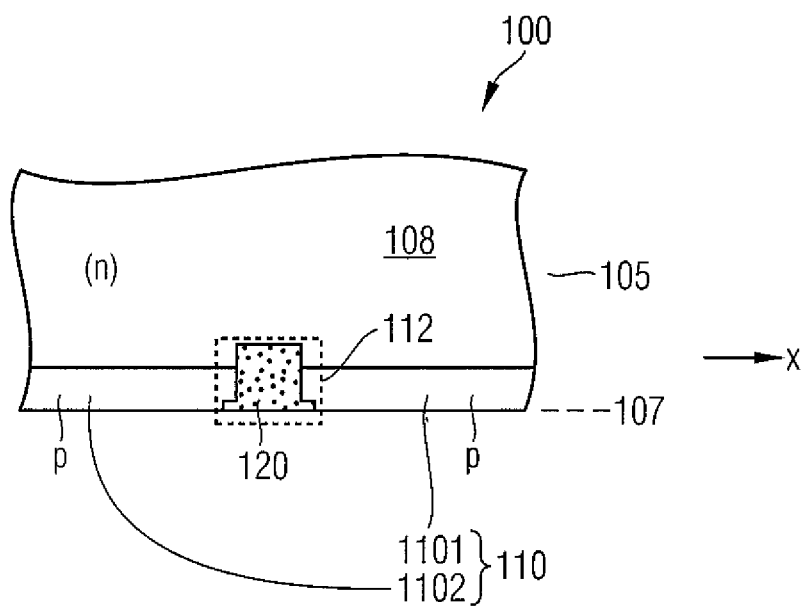

As is illustrated in the schematic cross-sectional view of another embodiment of the IGBT 100 illustrated in FIG. 5, the negative temperature coefficient thermistor 120 may not only fully cover the area 112 between the first and second parts 1101, 1102 of the collector injection structure 110 but the negative temperature coefficient thermistor 120 may even extend to a greater depth into the semiconductor body 105 from the second surface 107 than the collector injection structure 110.

Figure 6:
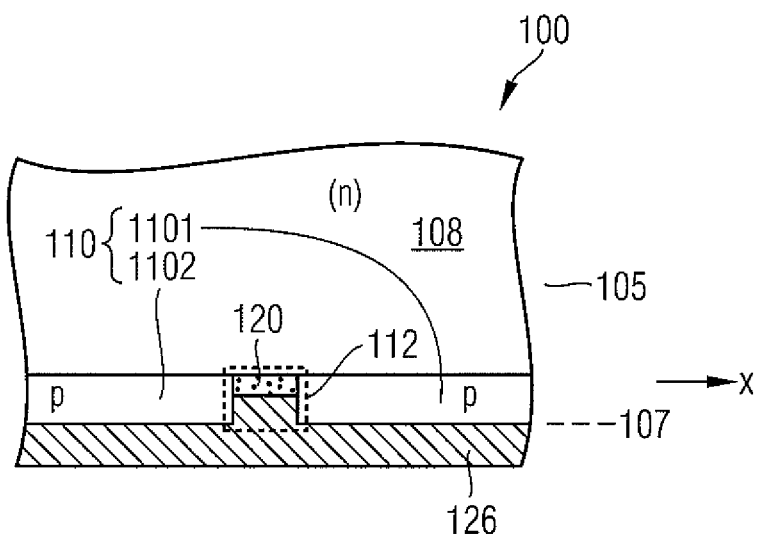

As is illustrated in the schematic cross-sectional view of the IGBT 100 according to the embodiment of FIG. 6, only a top part of the area 112 between the first and second parts 1101, 1102 of the collector injection structure 110 is covered by the negative temperature coefficient thermistor 120, whereas a bottom part of the area 112 is covered by a conductive material such as a collector contact 126 made of one or more conductive material(s) or layer(s) such as metal(s) and/or highly doped semiconductor(s).

In the embodiments described with reference to FIGS. 1 to 6, the negative temperature coefficient thermistor 120 adjoins the first zone 108 in an area between the first and second parts 1101, 1102 of the collector injection structure 110. According to an embodiment, a top side of the negative temperature coefficient thermistor 120 is in contact with the first zone 108, for example a first part of the first zone 108, whereas a bottom side of the negative temperature coefficient thermistor 120 is in contact with a collector contact such as the collector contact 126 illustrated in FIG. 6. A parallel connection of the collector injection structure 110 and the negative temperature coefficient thermistor 120 is electrically connected between the first zone 108 and the collector terminal C.

Figure 7:
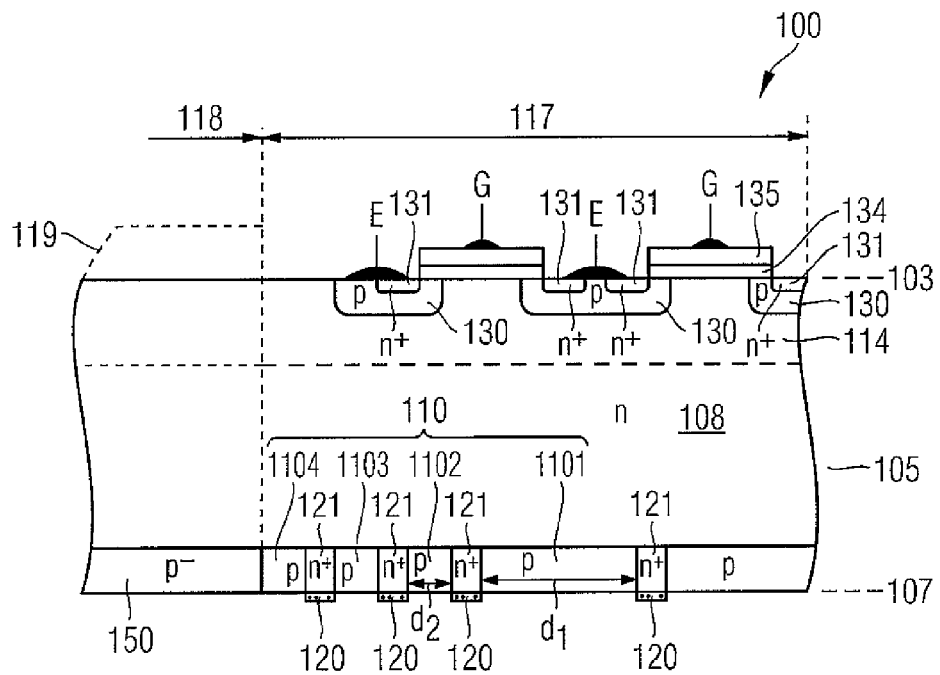
FIGS. 7 to 9 illustrate cross-sectional views of embodiments of an IGBT including a doped region adjoining a collector side in a junction termination area.

In the schematic cross-sectional view of the IGBT 100 illustrated in FIG. 7, a planar gate IGBT is illustrated. In the functional region 114 of the IGBT 100, body and source regions 130, 131 are electrically connected to the emitter terminal E. An optional highly doped body contact zone may be arranged between the body region and a contact of the emitter terminal E for improving contact resistance. A gate dielectric 134 is arranged between the first surface 103 of the semiconductor body 105 and a gate electrode 135. The gate electrode 135 is electrically connected to the gate terminal G. Outside the transistor cell area 117 in a junction termination area 118, junction termination structures 119 including one or more of field plates, ring structures such as floating guard rings or ring segments, junction termination extension (JTE) structures and variations of lateral doping (VLD) structures may be arranged.

In the junction termination area 118, a doped region 150 adjoins the second surface 107. A doping concentration in the doped region 150 differs from the doping concentration of the collector injection structure 110. In the embodiment illustrated in FIG. 7, a conductivity type of the doped region 150 equals the conductivity type of the collector injection structure 110, whereas a doping concentration of the doped region 150 is smaller than the doping concentration of the collector injection structure 110. The doped region 150 allows for a high dynamic robustness.

According to the embodiment illustrated in FIG. 7, the illustrated part of the collector injection structure 110 includes first to fourth parts 1101, 1102, 1103, 1104 and a lateral dimension $d_1$ of the first part 1101 is greater than a lateral dimension $d_2$ of the second part 1102. A parallel connection of the negative temperature coefficient thermistor 120 and the collector injection structure 110 of the embodiment illustrated in FIG. 7 is similar to the embodiment illustrated in FIG. 2.

Figure 8:
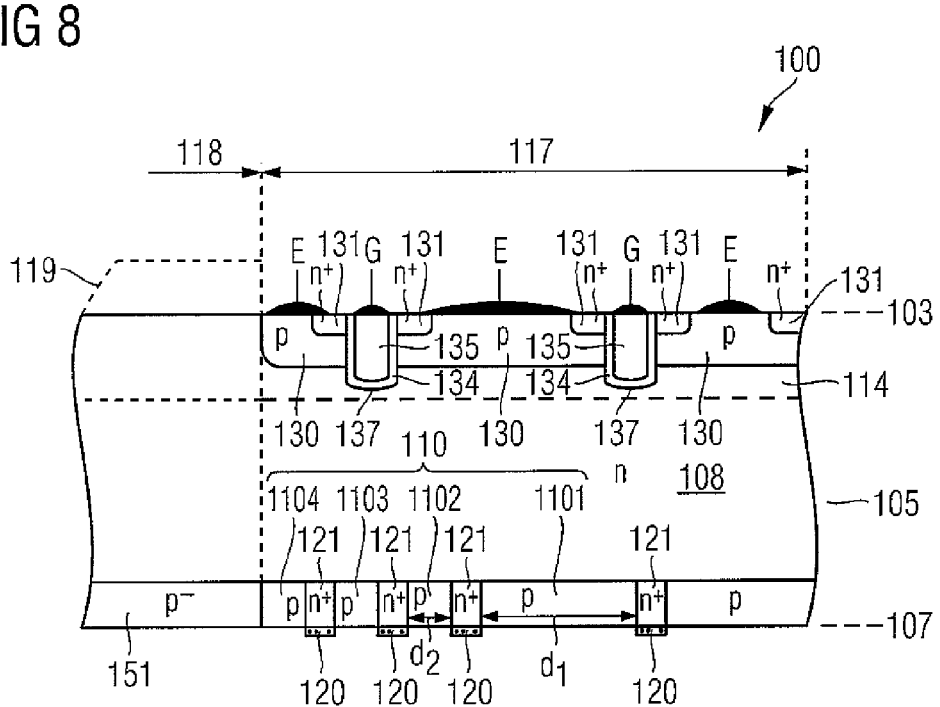

In the schematic cross-sectional view of the IGBT 100 illustrated in FIG. 8, a trench gate IGBT is illustrated. In the functional region 114 of the IGBT 100, body and source regions 130, 131 are electrically connected to the emitter terminal E. An optional highly doped body contact zone may be arranged between the body region and a contact of the emitter terminal E for improving contact resistance. A gate dielectric 134 and a gate electrode 135 are arranged in a trench 137 extending into the semiconductor body 105 from the first surface 103 of the semiconductor body 105. The gate electrode 135 is electrically connected to the gate terminal G. Outside the transistor cell area 117 in a junction termination area 118, junction termination structures 119 including one or more of field plates, ring structures such as floating guard rings or ring segments, junction termination extension (JTE) structures and variations of lateral doping (VLD) structures may be arranged.

In the junction termination area 118, a doped region 151 adjoins the second surface 107. According to an embodiment, a doping profile and the conductivity type in the doped region 151 may correspond to the doping profile and the conductivity type in the short region 121. According to another embodiment, the conductivity type in the doped region 151 may correspond to conductivity type in the short region 121, but a doping concentration or dose of doping may be smaller in the doped region 151 than in the short region 121. The doped region 151 allows for a high dynamic robustness.

According to the embodiment illustrated in FIG. 8, the illustrated part of the collector injection structure 110 includes first to fourth parts 1101, 1102, 1103, 1104 and a lateral dimension $d_1$ of the first part 1101 is greater than a lateral dimension $d_2$ of the second part 1102. A parallel connection of the negative temperature coefficient thermistor 120 and the collector injection structure 110 of the embodiment illustrated in FIG. 7 is similar to the embodiment illustrated in FIG. 2.

Figure 9:
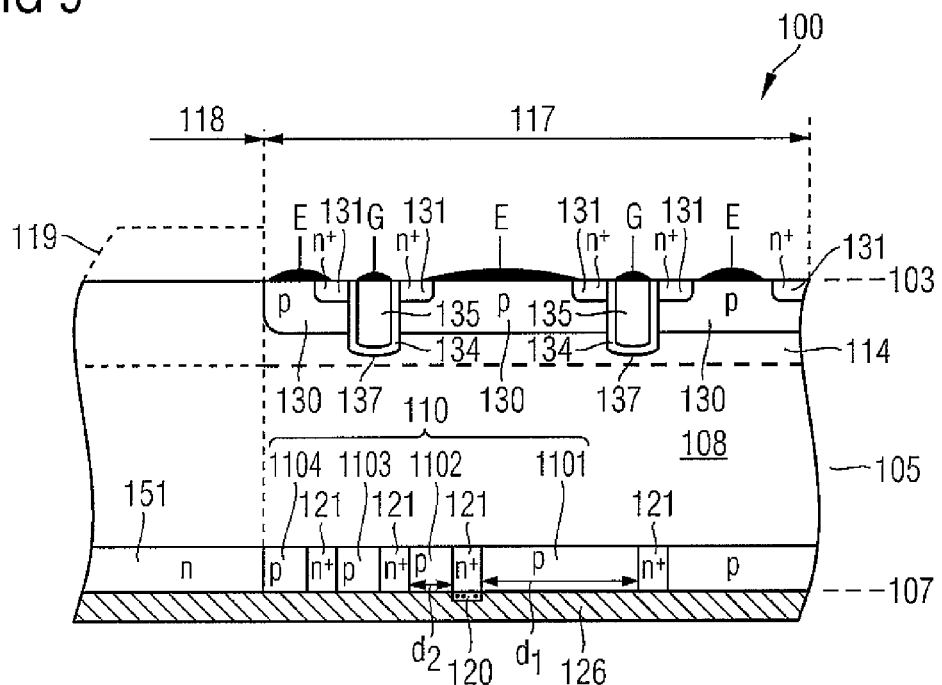

In the schematic cross-sectional view of the IGBT 100 illustrated in FIG. 9, an embodiment of a trench gate IGBT is illustrated. Since the IGBTs illustrated in FIGS. 8 and 9 are similar with regard to many structural elements, reference is made to the details given above with regard to FIG. 8. In the IGBT 100 illustrated in FIG. 9, the short regions 121 sandwiched between the third and fourth parts 1103, 1104, and between the second and third parts 1102, 1103 of the collector injection structure 110 along the lateral direction x are in contact to the collector contact 126 electrically connected to the collector injection structure 110. Thus, the IGBT 100 illustrated in FIG. 9 is a reverse conducting (RC) IGBT.

Each one of the IGBTs 100 illustrated in FIGS. 1 to 9 may include a planar gate, for example as illustrated in FIG. 7 or a trench gate, for example as illustrated in FIG. 8.

Figure 10:
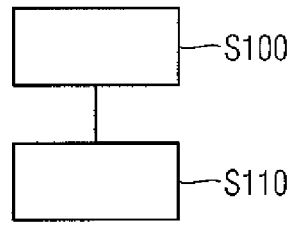
FIG. 10 is a chart for illustrating a method of manufacturing an IGBT.

FIG. 10 is a chart for illustrating a method of manufacturing an insulated gate bipolar transistor.

Process feature S100 includes forming a collector injection structure at a second surface of a semiconductor body having opposite first and second surfaces, wherein the semiconductor body includes a first zone of a first conductivity and the collector injection structure is of a second conductivity type comprising a first part and a second part at a lateral distance from each other.

Process feature S110 includes forming a negative temperature coefficient thermistor adjoining the first zone in an area between the first and second parts.

Further processes, inter alia, for example processes for forming gate electrodes, gate dielectrics, source regions, body regions or other functional semiconductor regions, contacts and/or wiring at the first and second surfaces 103, 107 may be carried out before, between or after process features S100, S110.

Figure 11A:
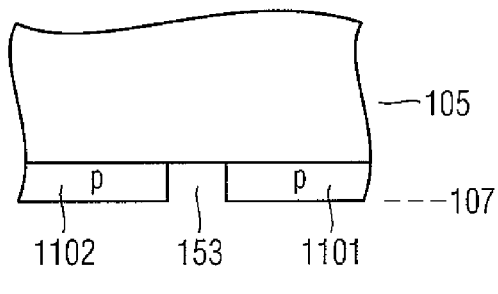
FIGS. 11A and 11B are cross-sectional views of a semiconductor body for illustrating processes of forming separate parts of a collector injection structure.

According to an embodiment illustrated in FIG. 11A, the collector injection structure 110 and the negative temperature coefficient thermistor 120 are formed by etching a trench 153 into the semiconductor body 105 from the second surface 107, wherein the trench 153 separates the first and second parts 1101, 1102. The negative temperature coefficient thermistor 120 is formed in the trench 153 resulting in a structure as illustrated in FIG. 3, for example.

Figure 11B:
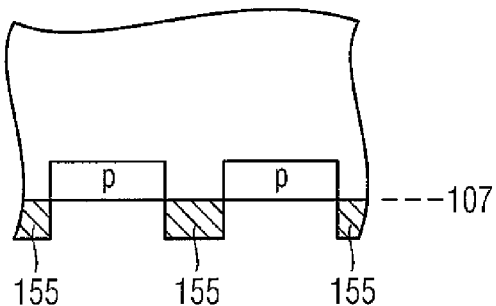

According to another embodiment illustrated in FIG. 11B, the collector injection structure 110 and the negative temperature coefficient thermistor 120 are formed by introducing dopants into the semiconductor body 105 from the second surface 107 through a patterned mask 155, for example by a diffusion process and/or an ion implantation process. The negative temperature coefficient thermistor 120 is formed at the second surface 107 adjoining the first zone 108 in the area between the first and second parts 1101, 1102 resulting in a structure as illustrated in FIG. 2, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An insulated gate bipolar transistor, comprising:
    an emitter terminal at a first surface of a semiconductor body;
    a collector terminal at a second surface of the semiconductor body;
    a first zone of a first conductivity type in the semiconductor body between the first and second surfaces;
    a collector injection structure adjoining the second surface, the collector injection structure being of a second conductivity type and comprising a first part and a second part at a first lateral distance from each other; and
    a negative temperature coefficient thermistor adjoining the first zone in an area between the first and second parts,
    wherein the negative temperature coefficient thermistor is separate from and comprises a different material than the collector injection structure.

2. The insulated gate bipolar transistor of claim 1, wherein a short region of the first zone is sandwiched between the first and second parts along a lateral direction.

3. The insulated gate bipolar transistor of claim 2, wherein the first zone includes a drift region having a smaller doping concentration than the short region.

4. The insulated gate bipolar transistor of claim 3, further comprising a doped region adjoining the second surface in a junction termination area surrounding a transistor cell area including the first and second parts, wherein a doping concentration in the doped region differs from the doping concentration of the drift region.

5. The insulated gate bipolar transistor of claim 4, wherein the doped region is of the second conductivity type having a smaller doping concentration than the first and second parts.

6. The insulated gate bipolar transistor of claim 4, wherein the doped region is of the first conductivity type having a same profile of doping concentration along a vertical direction as the area between the first and second parts.

7. The insulated gate bipolar transistor of claim 1, wherein the negative temperature coefficient thermistor is sandwiched between the first and second parts along a lateral direction.

8. The insulated gate bipolar transistor of claim 1, wherein an interface between the negative temperature coefficient thermistor and a first part of the first zone is sandwiched between the first and second parts along a lateral direction.

9. The insulated gate bipolar transistor of claim 1, wherein the negative temperature coefficient thermistor is arranged between a first part of the first zone and a collector contact electrically connected to the collector injection structure.

10. The insulated gate bipolar transistor of claim 1, wherein the first lateral distance between the first and second parts is in a range between 0.5 µm and 500 µm.

11. The insulated gate bipolar transistor of claim 1, wherein the collector injection structure further comprises a third part and a fourth part at a second lateral distance from each other; and a part of the first zone sandwiched between the third and fourth parts along a lateral direction is in contact to a collector contact electrically connected to the collector injection structure.

12. The insulated gate bipolar transistor of claim 1, wherein the first and second parts are arranged in a transistor cell area.

13. The insulated gate bipolar transistor of claim 1, wherein a lateral dimension of the first part is greater than a lateral dimension of the second part.

14. The insulated gate bipolar transistor of claim 1, wherein the negative temperature coefficient thermistor is a material characterized by a phase change from an amorphous phase into a crystalline phase at a critical temperature.

15. The insulated gate bipolar transistor of claim 14, wherein the material is a chalcogenide.

16. The insulated gate bipolar transistor of claim 15, wherein the chalcogenide includes at least one of GeTe and $Ge_2Sb_2Te_5$.

17. The insulated gate bipolar transistor of claim 1, wherein the negative temperature coefficient thermistor is a semiconductor material having a bandgap smaller than a bandgap of a semiconductor material of the semiconductor body.

18. The insulated gate bipolar transistor of claim 1, wherein the negative temperature coefficient thermistor contacts the first and second parts of the collector injection structure.

19. The insulated gate bipolar transistor of claim 18, wherein the negative temperature coefficient thermistor contacts the first and second parts of the collector injection structure at the second surface of the semiconductor body.

* * * * *